June 3, 1969 HUNG CHANG LIN ET AL 3,448,397

MOS FIELD EFFECT TRANSISTOR AMPLIFIER APPARATUS

Filed July 15, 1966

WITNESSES:
Bernard R. Giegue
James F. Young

INVENTORS
Hung Chang Lin and
Herman W. van Beek.
BY Gordon H. Telfer
ATTORNEY

United States Patent Office 3,448,397

Patented June 3, 1969

3,448,397

MOS FIELD EFFECT TRANSISTOR AMPLIFIER APPARATUS

Hung Chang Lin, Silver Spring, and Herman W. van Beek, Laurel, Md., assignors to Westinghouse Electric Corporation, Pittsburgh, Pa., a corporation of Pennsylvania Filed July 15, 1966, Ser. No. 565,594

Int. Cl. H03f *3/14, 3/04*

U.S. Cl. 330—38 9 Claims

ABSTRACT OF THE DISCLOSURE

A circuit with means for biasing the gate of a first field effect transistor is provided by an additional field effect transistor with electrical coupling between the drain of the second transistor to the gate of the active device. Potential is applied to operate the second transistor in cutoff so that it exhibits a large resistance suitable for biasing, by means of a potential applied to the source thereof, the gate of the active device.

This application is directed to electronic apparatus including MOS field effect transistors and, particularlly, to combinations of MOS field effect transistors for the performance of amplifier functions that are particularly suitable for fabrication in a semiconductor integrated circuit.

MOS field effect transistors are known devices of current interest because they offer advantages over both bipolar transistors and junction type field effect transistors. They are particularly attractive for provindig high input impedance.

In fabricating integrated circuits or functional blocks problems are encountered in minimizing the semiconductor surface area required and in simplifying the fabrication process. In low frequency AC amplifiers, for example, high input resistance to the initial amplification stage is desirable to permit the use of as small as possible a coupling capacitor so that when such a circuit is integrated the capacitor does not require an undue amount of the surface area. This makes the use of a field effect transistor desirable because of its high input resistance. A field effect transistor, however, requires a large gate biasing resistance of the order of megohms. Such large resistances are difficult to achieve in integrated circuits without complicating the fabrication process and without utilizing excessive semiconductive area. In fabricating an integrated circuit including MOS transistors and resistors, the resistors require an extra processing step. Hence, an external resistor may have to be used with the usual disadvantages of increased size and cost and lower reliability.

In copending application Ser. No. 561,281, filed June 28, 1966 by H. C. Lin and assigned to the assignee of this invention, there is disclosed the use of an MOS field effect transistor to provide the load resistance for developing the working current in MOS field effect transistor logic circuits. Such a configuration is not suitable for solving the problems of providing a large gate biasing resistance because of the requirement to limit the current to very small values, such as about $10^{-10}$ amperes by a resistance of the order of megohms.

It is, therefore, an object of this invention to provide improved electronic apparatus for the performance of amplifier functions by MOS field effect transistors suitable for integrating without requiring excessive semiconductive area or complication of the fabrication process.

Another object is to provide MOS field effect transistor apparatus with means for biasing the gate that requires little semiconductor surface area or additional fabrication steps in addition to those required for the MOS field effect transistor.

The invention, briefly, achieves the above-mentioned and additional objects and advantages through the provision of an MOS field effect transistor, in addition to the active device, that may be of similar configuration with means for electrically coupling the drain of the second transistor to the gate electrode of the active device and with means for applying potentials to operate the second transistor in cutoff so that it exhibits a large resistance suitable for biasing the gate of the active device.

The two MOS transistors can be fabricated in an integrated circuit readily since they may be of the same conductivity type. It is necessary that the regions in which the two transistors are disposed be electrically isolated from each other. The source of the active transistor may be directly connected to the underlying semiconductive region or left floating although the underlying region of the second transistor should be kept at a floating potential.

The invention, together with the above-mentioned and additional objects and advantages of it, will be better understood by referring to the following description taken with the accompanying drawing, wherein.

Figure 1:
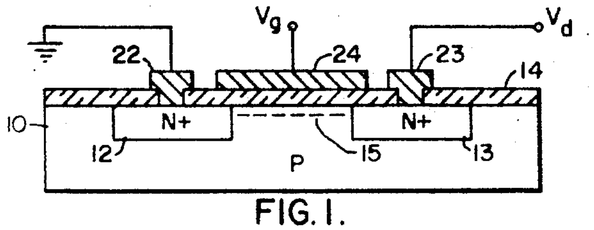
FIGURE 1 is a cross-sectional view of a single MOS field effect transistor as is utilized in the present invention.
Figure 2:
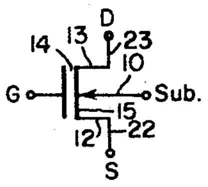
FIG. 2 is an illustration of the symbol employed herein for a device as shown in FIG. 1.
Figure 3:
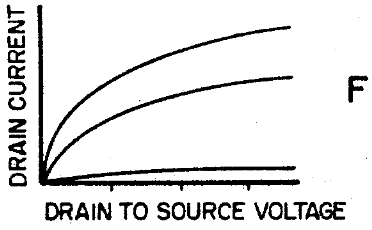
FIG. 3 is a graph of curves of typical operating characteristics for a device such as that shown in FIG. 1.

FIGS. 1, 2 and 3 are included for background information to enable a better understanding of the present invention. In FIG. 1, an MOS field effect transistor structure is illustrated that includes a P-type substrate 10 and N-type source and drain regions 12 and 13 respectively. The substrate may be of silicon and the regions 12 and 13 produced by selective diffusion using oxide masking techniques. A layer of insulating material 14, such as one of silicon dioxide, is disposed on the upper surface except where contacts 22 and 23, respectively, make contact with the regions 12 and 13. A gate contact 24 is disposed on the surface of the insulating layer 14 over the portion of substrate 10 disposed between the regions 12 and 13. This portion of the structure, referred to as the channel region 15, by reason of the presence of the insulating layer 14 has a layer of negative charges near the surface, hence inverting its conductivity to N-type and providing an N channel MOS transistor.

FIG. 2 shows the symbol employed herein to represent a structure like that of FIG. 1. The reference numerals indicate the correspondence of the elements of FIG. 2 with those of FIG. 1 and the symbols G, D, S and Sub. are used to designate the gate, drain, source and substrate, respectively, although the reference numerals and identifying symbols will not be repeated in subsequent figures.

An additional contact may or may not be provided on the substrate region 10. Generally, it may be at a floating potential not requiring a contact. It may also be tied to a reference potential which may be the same as that of the source electrode. FIG. 1 illustrates the application of a voltage $V_d$ across the drain and source regions 12 and 13 and a voltage $V_g$ applied to the gate electrode 24.

A device like that of FIG. 1 may be made with the conductivity type of the various regions reversed and such device may be utilized in the subsequently described apparatus with reversal of the indicated voltage polarities.

Devices like that shown in FIG. 1 may be made and operated in two ways. The differences may result in part from the nature of the fabrication process employed to make the structure and also from the manner in which potentials are applied to it. In some devices, called depletion mode devices, there is appreciable conduction from source to drain with zero voltage on the gate. This conduction is decreased, in an N channel device, by application of increasingly negative voltages to the gate.

Enhancement mode devices have essentially zero current at zero gate voltage but increasingly larger currents are conducted through application of more positive gate bias voltages, in an N channel device.

In the present invention, either enhancement mode or depletion mode devices may be used although the discussion herein pertains particularly to depletion mode devices. It is also suitable to use junction type field effect devices, which exhibit depletion mode operation, in the apparatus of this invention.

FIG. 3 illustrates typical performance of a depletion type N channel MOSFET. The three curves represent different values of gate voltage with the upper one being the least negative or most positive. The lowest curve is that referred to as cutoff and while it is shown spaced from the horizontal axis for clarity of illustration it is the characteristic exhibited when the gate voltage is so negative that negligible drain current flows.

Figure 4:
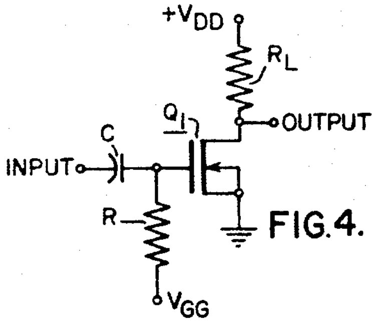
FIG. 4 is a circuit schematic of an MOS transistor circiut to which the present invention is particularly applicable.

FIG. 4 illustrates a circuit with which the present invention is advantageously practiced. FIG. 4 is an MOSFET amplifier or at least the input stage of an amplifier circuit including the transistor $Q_1$ that may be as described with the substrate shorted to its source. An input signal is supplied to the gate electrode through a blocking capacitor C. The gate bias voltage is applied through resistance R by voltage source $V_{GG}$. The drain of $Q_1$ may be connected to a positive potential source $V_{DD}$ through a load resistance $R_L$. The output is derived from the drain. As was discussed in the introduction herein there are difficulties in integrating such a large magnitude bias resistance as R with MOS transistors by conventional techniques.

Figure 5:
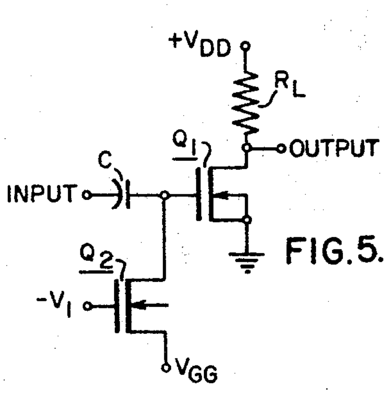
FIG. 5 is a circuit schematic of one embodiment of the present invention.

Referring to FIG. 5, there is shown a circuit similar to that of FIG. 4. The resistance R, however, has been replaced by a second MOSFET $Q_2$. The source of $Q_2$ is connected to a supply voltage $V_{GG}$. The drain of $Q_2$ is connected to the gate electrode of $Q_1$. The gate of $Q_2$ is connected to a voltage V-I sufficiently negative so as to bias $Q_2$ to the cutoff condition. Referring again to FIG. 3, it may be understood that to maintain a high input impedance at $Q_1$ it is necessary that $Q_2$ have extremely low drain current and hence $Q_2$ must operate near the origin of the V-I characteristic. By operating in cutoff, the drain to source output impedance of $Q_2$ is very high as evidenced by the practically horizontal characteristic of the lowermost curve of FIG. 3.

Figure 6:
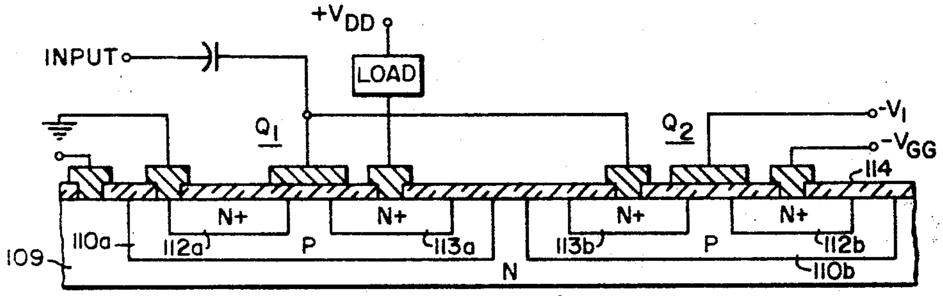
FIG. 6 is a partial sectional view of an integrated circuit with indicated circuit connections to provide operation as the circuit of FIG. 5.

FIG. 6 illustrates a partial integrated circuit incorporating the elements shown in FIG. 5. Elements of FIG. 6 have reference numerals having the same last two digits as the corresponding elements of FIG. 1. $Q_1$ and $Q_2$ comprise regions of P-type semiconductivity **110*a* and 110*b* that are isolated from each other on an N-type substrate 109 with each having N+ source and drain regions 112*a*, 113*a*, 112*b* and 113*b* disposed therein. Substrate 109 is preferably connected to some reference potential that is positive with respect to ground. The P-type region 110*a* of $Q_1$ may be connected with the source 112*a* to ground, as shown, or to a negative potential or it may be left floating. The P-type region 110*b* of $Q_2$ must be left floating. The gate of $Q_1$ may assume the potential of region 110*b* during no-signal conditions. When there is a positive signal, the P-N junction formed by 110*b* and 112*b* is forward-biased and the potential of 110*b* is nearly equal to $V_{GG}$. When there is a negative signal, the P-N junction between 113*b* and 110*b* is forward-biased and 110*b* assumes nearly the signal voltage. If 110*b* were connected to either 113*b* or 112*b*, a short circuit would result for one polarity of the signal, thus necessitating 110*b*** be floating.

In the quiescent condition, the gate of $Q_1$ assumes a potential $V_{GG}$ because of the small current flow through $Q_2$. Either the source junction or the drain junction is necessarily forward-biased and the other is reversed biased in transistor $Q_2$. When an input signal is impressed on the gate of $Q_1$, the drain of $Q_2$ may be swinging positive and negative with respect to $V_{GG}$. However, as can be seen from FIG. 3, the source or drain voltage may vary considerably and still the impedance from drain to source or from the gate of $Q_1$ to the source $V_{GG}$ remains high. This type of operation is thus more satisfactory than that provided in apparatus as described in copending application Ser. No. 325,373, filed Nov. 21, 1963, now Patent 3,278,853, issued Oct. 11, 1966, by H. C. Lin and assigned to the assignee of the present invention. In that application there was disclosed the use of a forward-biased diode for biasing the gate of a junction type field effect transistor. To maintain high resistance, little voltage swing could be tolerated.

Utilization of the large dynamic resistance of $Q_2$ permits the use of a small blocking capacitor C that may also be readily integrated. $Q_2$ requires only about 0.00001 the area that a conventionally formed diffused resistance (about 200 ohms per square) would require.

Merely as an example, the structure of FIG. 6 may be formed utilizing as a starting material a substrate of N-type conductivity material having a resistivity of about 2 ohm-centimeters. Over a major surface of the substrate is formed a layer of P-type conductivity by epitaxial growth techniques that may also have a resistivity of about 2 ohm-centimeters. Isolation walls of N-type material are diffused through the P-type epitaxial layer to separate the P-type regions of the MOSFET. In a subsequent diffusion operation, the source and drain regions are also formed by selective diffusion. That diffusion may be performed to a surface concentration of about $10^{20}$ to $10^{21}$ atoms per cubic centimeter. For appropriate gate operation in a depletion mode device, the silicon dioxide layer 114, at least in the vicinity of the gate electrode, should have a thickness of about 1200 angstroms. It is preferred that the structure also include P+ guard band regions surrounding the source and drain regions of each MOSFET in accordance with the teachings of copending application, Ser. No. 562,591, filed July 5, 1966 by Lin and Shiota and assigned to the assignee of this invention which should be referred to for further information.

While the present invention has been shown and described in a few forms only, it will be apparent that modifications may be made without departing from the scope thereof.

What is claimed is:

1. Electronic apparatus comprising:

a unitary structure including first and second semiconductive regions of a first conductivity type with isolation means therebetween;

a first field effect transistor having a channel region, and source and drain regions in said first region and a gate electrode insulated from said channel region by an insulating layer;

a second field effect transistor having a channel region, and source and drain regions in said second region;

said source and drain regions of said first and second transistors being of a second conductivity type;

means electrically coupling said drain region of said second transistor and said gate electrode of said first transistor; and means to maintain said second transistor in a cutoff condition so it exhibits a large resistance for biasing said gate electrode of said first transistor.

2. The subject matter of claim 1 further comprising: means for applying an input signal to said gate electrode of said first transistor, means for applying a D.C. voltage across said source and drain regions of said first transistor, and means for deriving an output signal from said drain of said first transistor.

3. The subject matter of claim 1 wherein: said source region of said first transistor and said first region have a direct electrical connection therebetween and said second region is at a floating potential.

4. The subject matter of claim 1 wherein: said unitary structure comprises a substrate region of said second conductivity type with a portion thereof extending between said first and second regions and providing said isolation means; said substrate region being maintained at a potential to reverse bias PN junctions between said substrate region and said first and second regions.

5. The subject matter of claim 1 wherein: said means to maintain said second transistor in a cutoff condition includes a source of D.C. voltage connected to said source of said second transistor.

6. The subject matter of claim 5 wherein: said second field effect transistor also has a gate electrode insulated from said channel region thereof by an insulating layer; and said means to maintain said second transistor in a cutoff condition further includes a source of D.C. voltage connected to said gate electrode of said second transistor.

7. The subject matter of claim 6 further comprising: means for applying an input signal to said gate electrode of said first transistor, means for applying a D.C. voltage across said source and drain regions of said first transistor, and means for deriving an output signal from said drain of said first transistor.

8. The subject matter of claim 6 wherein: said source region of said first transistor and said first region have a direct electrical connection therebetween and said second region is at a floating potential.

9. The subject matter of claim 6 wherein: said unitary structure comprises a substrate region of said second conductivity type with a portion thereof extending between said first and second regions and providing said isolation means; said substrate region being maintained at a potential to reverse bias PN junctions between said substrate region and said first and second regions.

References Cited

UNITED STATES PATENTS

| | | | |
|---|---|---|---|
| 3,229,218 | 1/1966 | Sickles et al. | 330—29 |
| 3,293,087 | 12/1966 | Porter. | |
| 3,296,547 | 1/1967 | Sickles | 330—38 X |
| 3,307,110 | 2/1967 | Harwood | 330—38 X |

ROY LAKE, *Primary Examiner.*

J. B. MULLINS, *Assistant Examiner.*

U.S. Cl. X.R.

307—303, 304; 330—40